(12) United States Patent
Christensen et al.

(10) Patent No.: US 6,431,814 B1
(45) Date of Patent: Aug. 13, 2002

(54) INTEGRATED WAFER STOCKER AND SORTER WITH INTEGRITY VERIFICATION SYSTEM

(75) Inventors: Eric Christensen, Austin; Russel Shirley, Pflugerville; Michael R. Conboy; Elfido Coss, Jr., both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/578,101

(22) Filed: May 22, 2000

Related U.S. Application Data

(63) Continuation-in-part of application No. 09/496,531, filed on Feb. 2, 2000.

(51) Int. Cl.[7] .............................................. B65B 21/02
(52) U.S. Cl. ..................................................... 414/416
(58) Field of Search .................... 438/14, 15; 414/416; 324/158.1; 700/121; 356/243.1

(56) References Cited

U.S. PATENT DOCUMENTS

| | | | | |
|---|---|---|---|---|
| 5,719,495 A | * | 2/1998 | Moslehi | 324/158.1 |
| 5,751,581 A | | 5/1998 | Tau et al. | |
| 6,043,877 A | * | 3/2000 | Land | 356/243.1 |
| 6,164,894 A | * | 12/2000 | Cheng | 414/416 |
| 6,308,107 B1 | * | 10/2001 | Conboy | 700/121 |

* cited by examiner

Primary Examiner—John F. Niebling
Assistant Examiner—Andre Stevenson

(57) ABSTRACT

A system for verifying the integrity of components moving within a material handling system ensures that only components of acceptable integrity and condition are allowed to move onto the processing locations of a semiconductor plant. In an example embodiment, components that are warped or cracked are initially detected and scanned by a beam break system and/or an optical system. An integrity verification assessment is made immediately on the component to determine whether the scanned component meets with a predefined baseline parameter or characteristic. The components that do not pass integrity verification are then removed from the material handling system while the components that pass move on to the first processing location.

15 Claims, 7 Drawing Sheets

INTEGRATED WAFER STOCKER AND SORTER WITH INTEGRITY VERIFICATION SYSTEM

RELATED APPLICATION

This application is a continuation in part of previously filed application entitled "Integrated Wafer Stocker and Sorter" with Ser. No. 09/496,531, filed on Feb. 2, 2000, which is incorporated herein by reference.

FIELD OF THE INVENTION

The present invention generally relates to semiconductor fabrication equipment and, more particularly, to verifying the integrity of components moving into an automated material handling system that operates within a semiconductor processing plant.

BACKGROUND OF THE INVENTION

A conventional semiconductor fabrication plant typically includes multiple fabrication areas or bays interconnected by a path, such as a conveyor belt. Each bay generally includes the requisite fabrication tools (interconnected by a subpath) to process semiconductor wafers for a particular purpose, such as photolithography, chemical-mechanical polishing, or chemical vapor deposition. Material stockers or stocking tools generally are located about the plant and store semiconductor wafers waiting to be processed. The wafers are typically stored in containers, such as cassettes, each of which can hold up to 25 wafers. The cassettes are then stored in carriers that facilitate movement throughout the plant. The carriers can move material in lots, primarily between stocking locations, such as production wafers, test wafers, or empty cassettes if necessary to ensure that the process is moving smoothly.

A material stocker typically services two or more bays and can hold hundreds of cassettes. While not shown, the semiconductor fabrication plant, including the bays, material stockers and an automated material handling system, typically operates under control of a distributed computer system running a factory management program. Another program is implemented to track and control the movement of material in the carriers throughout the plant.

A typical semiconductor fabrication plant handles the processing of thousands of wafers at any given time. The wafers are typically divided into lots that undergo different processing sequences. Most of the time the mix of material, in the form of lots, moving through the plant includes test wafers and empty cassettes that are moved frequently into and out of the processing line. A more detailed discussion of the movement of lots throughout a semiconductor manufacturing facility may be found in U.S. Pat. No. 5,751,581 issued May 12, 1998 to Tau et al., entitled "Material Movement Server," which is herein incorporated by reference.

Cycle time is increased when the wafers have to be sorted prior to being introduced in the line and a wafer sorter is not readily available. Profitable short term opportunities could be pursued if the manufacturing line were more readily responsive to event changes or management directives. In view of the above, there is a need to integrate such event changes or a management level directives into the production schedule without substantially disrupting the flow of material through the plant, lowering the manufacturing yield or increasing cycle time. Further, processing cycle times are increased when components moving within the material handling system are out of tolerance or damaged and an operator fails to remove the unacceptable component before reaching the first processing location. Unacceptable components or components of questionable integrity eventually lead to shutdowns or processing delays, using up valuable processing time.

SUMMARY OF THE INVENTION

The present invention is directed to addressing the above and other needs in connection with improving efficiencies of wafer stocking and sorting systems. Further, the present invention addresses the needs of reducing processing cycle times by ensuring that components that move through the material handling system are in acceptable condition before moving to the first processing location.

The present invention is exemplified in a number of implementations and applications, some of which are summarized below. It has been discovered herewith that reduced cycle times are realized by having the capability of sorting a wafer lot while at a stocking location irrespective of other operations on the processing line, as described in various aspects below. Further, based on the type of wafer lot being processed, the stocker/sorter apparatus can automatically make wafer adjustments with respect to certain recipes or conduct a recovery operation (in case of a loss of power) without having to seek out a separate wafer sorter. Accordingly, a wafer stocking and sorting apparatus that addresses this need of reducing cycle time and reducing the need for excessive handling of delicate wafers is described herein.

In one aspect of the invention, an apparatus includes a scanning arrangement that scans wafers and wafer carriers to identify codes located on the wafer carriers that indicate the position of a wafer within the carrier and by slot. A sorting arrangement sorts wafers and carriers within storage bins located in an enclosure. The apparatus also includes a computer arrangement that controls the scanning and sorting arrangements and stores data retrieved therefrom, the data being used for wafer selection and for tracking wafer movement from the start of processing.

According to another aspect of the invention, a system for storing and sorting wafers in a wafer processing system includes a plurality of stocking locations for wafers and cassettes. The system also includes a plurality of carriers having wafers and cassettes disposed therein. In addition, an apparatus for stocking and sorting wafers adapted to track wafer movement from the start of processing and to select wafers as a function of an externally provided directive. The system also includes a conveyor arrangement for moving wafers from one of the stocking locations to a processing location.

In yet another aspect of the invention, an apparatus for storing and sorting wafers for use in a wafer processing system includes a scanning device for scanning wafers and wafer carriers. The scanning device identifies codes located on the wafer carriers that indicate the position of a wafer within the carrier and by slot. A robotic arm sorts wafers and carriers within storage bins located in an enclosure. A computer arrangement controls the scanner and the robotic arm and stores data retrieved therefrom, the data being used for wafer selection and for tracking wafer movement from the start of processing.

In yet another aspect of the invention, a method for storing and sorting wafers for use in a wafer processing system includes scanning wafers and wafer carriers by identifying codes located on the wafer carriers that indicate the position of a wafer within the carrier and by slot. The wafers and carriers are sorted within storage bins located in an enclosure and a computer arrangement controlling the scanning and sorting and storing data retrieved therefrom is then used. The data retrieved is used for wafer selection and for tracking wafer movement from the start of processing.

In yet another aspect of the present invention, a method for verifying the integrity of components that move within a material handling system of a semiconductor processing plant includes defining a set of individual components to be verified in the material handling system. The defined set is then stored as data in a material handling system database. A corresponding baseline parameter range for each component to be verified in the handling system database is then defined and stored as data in the system database. The individual components moving within the material handling system are then scanned and scanned data is generated therefrom. The scanned component data is then compared to the baseline parameter range of the components to verify that the scanned components are acceptable to move within the material handling system to the first processing location.

In yet another aspect of the present invention, an apparatus for verifying the integrity of individual components, that move within a material handling system of a semiconductor processing plant, includes an arrangement for verifying integrity of a defined set of components as a function of a defined set of attributes. The integrity verification arrangement is disposed proximate to the material handling system. The apparatus further includes an arrangement for removing components from the material handling system that do not pass integrity verification.

In yet another aspect of the present invention, an apparatus for storing, sorting and verifying integrity of wafers that move within a material handling system in a wafer processing facility includes an enclosure having at least one access port disposed proximate to the material handling system. A screening arrangement adapted to verify wafer integrity as a function of a defined set of wafer attributes is also included, the screening arrangement being disposed proximate to the access port. A scanning arrangement for scanning wafers and wafer carriers is included, the scanning arrangement being disposed proximate to the screening arrangement and adapted to identify a code located on the wafer carriers that indicates the position of a wafer within the carrier. A sorter arrangement is included for sorting and storing wafers and carriers within the enclosure and for removing wafers from the enclosure that do not pass integrity verification.

In yet another aspect of the present invention, a pod carrier for transporting wafers and wafer cassettes within a material handling system of a semiconductor processing plant includes an enclosure having an access port. The enclosure includes a storage bin, adapted to store wafers within a wafer cassettes, and a sensing arrangement for sensing wafer presence and movement through the access port disposed proximate to the storage bin. The pod also includes an arrangement for conducting wafer integrity verification.

The above summary of the present invention is not intended to describe each illustrated embodiment or every implementation of the present invention. The figures in the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
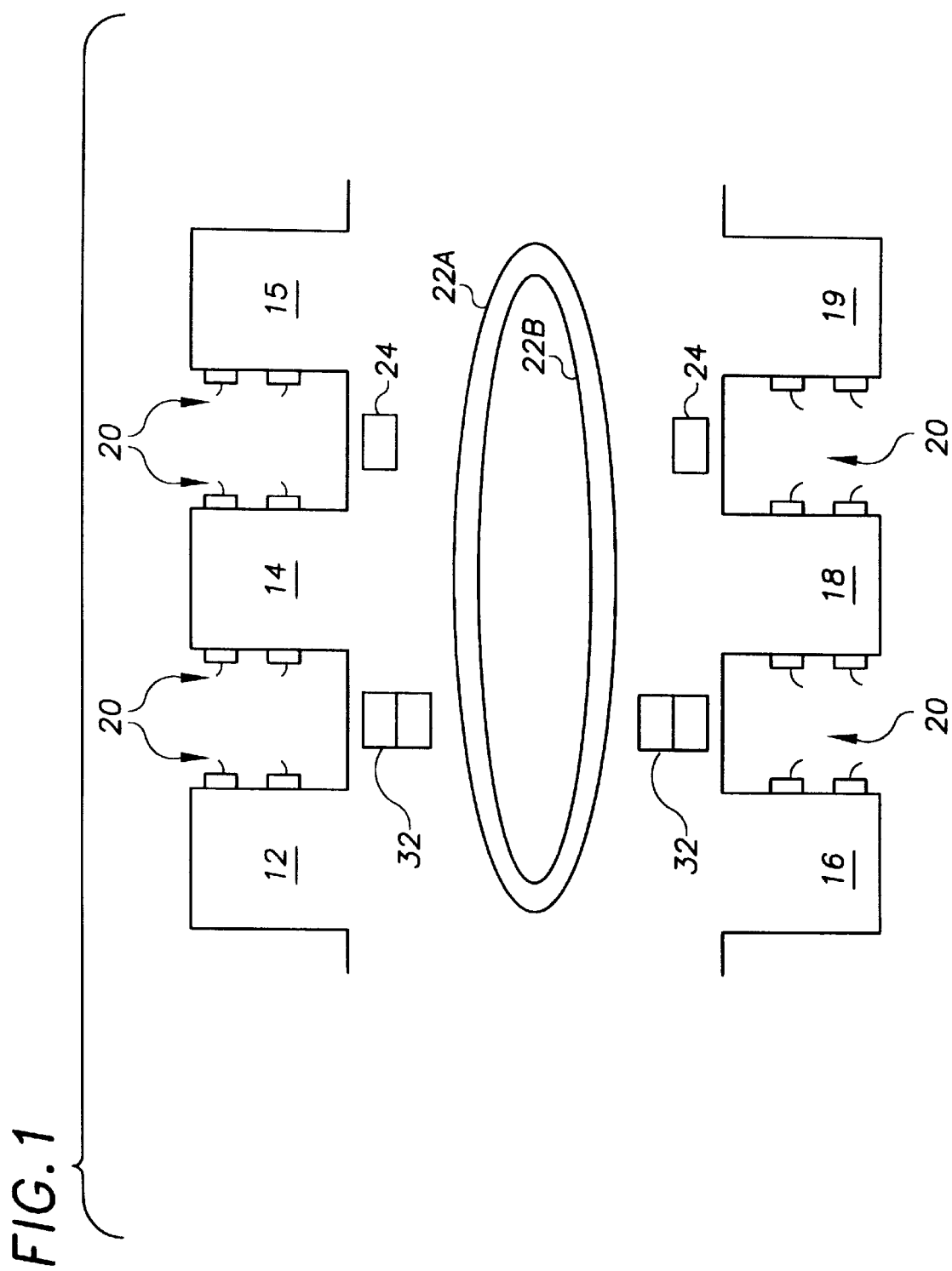
FIG. 1 is a schematic diagram showing the physical layout of a shop floor in accordance with an embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally directed to an apparatus for stocking and sorting wafers and cassettes. The invention is particularly suited for reducing the cycle time of processing wafers and reducing the risk of damage to the wafers due to excessive handling or line shutdowns caused by out of tolerance components that move within the material handling system. While the present invention is not necessarily limited to a wafer processing application the invention will be better appreciated using a discussion of exemplary embodiments in such a specific context.

In an example embodiment, a wafer stocking and sorting apparatus for use in a wafer processing system reduces cycle time and reduces the need for excessive handling of delicate wafers. The apparatus includes a scanning arrangement that scans wafers and wafer carriers to identify codes located on the wafer carriers that indicate the position of a wafer within the carrier and by slot. A sorting arrangement sorts wafers and carriers within storage bins located in an enclosure. The apparatus also includes a computer arrangement that controls the scanning and sorting arrangements and stores data retrieved therefrom, the data being used for wafer selection and for tracking wafer movement from the start of processing.

In a related embodiment, a method and system for verifying the integrity of components that move within a material handling system provides a high level of confidence that components moving within the material handling system are in acceptable condition. In one example, components that are warped or cracked are initially detected and scanned by a beam break system and an optical system. An integrity verification assessment is made immediately to determine whether the scanned component meets with a predefined baseline dimension parameter. The components that do not pass integrity verification are then removed from the material handling system by robotic arm while the components that pass move on to the first processing location. In other examples the components include wafers, pods, reticles and other components that move through a semiconductor facility on the material handling system.

Referring now to the figures, in FIG. 1 a schematic diagram of the physical layout of a shop floor 30 of a semiconductor fabrication facility includes multiple bays 12, 14, 15, 16, 18 and 19. The bays have various manufacturing tools 20 located about the bays and there is included a set of monorails 22a and 22b that move carriers with material lots, which may include cassettes, to and from various material stockers 24. A single material stocker usually services two bays, as shown, and a few wafer sorters 26a and 26b service several stockers or stocking locations. Wafer sorters are usually moved from one stocker to another depending on the need to sort wafers before the next processing step is to start. If the number of sorters available is less than the number of stockers that need them for sorting, then a bottleneck usually develops in the wafer processing system at one of the stocker locations, thereby increasing cycle time until a wafer sorter becomes available. Despite advanced planning and prepositioning of wafers and cassettes at certain locations, a last minute change in a wafer recipe may require the sorting/inspection function to be performed at a time when all of the available sorters are being utilized. Therefore, as it will become apparent providing an apparatus having the stocking and sorting functions integrated into one would not only improve manufacturing efficiency but also would improve flexibility in a wafer processing line.

A stocking/sorting apparatus 32 is located near bays 12 and 14 and another is located near bays 16 and 18. Stocker/sorter 32 provides wafer stocking and sorting functionality in a single enclosure and location. Stocker/sorter 32 has a computer arrangement therein that is coupled to the manufacturing facility system and to the overall facility management system. The computer arrangement controls the internal functions of the stocker/sorter and processes instructions from the manufacturing and management systems when changes are made to the processing of current wafer lots.

Where an error occurs in the stocking operation of stocker/sorters 32 or when its desired by the system manager (spot checks, etc.), the computer arrangement will initiate a mapping check of the wafer carriers contained within stocker/sorter 32, automatically verifying the contents. This includes, but is not limited to, all aspects of wafer count, wafer presence versus cassette identification, wafer slot count per location check, slot locations, single and limited wafer identification, and wafer rotational offset. If an error occurs in the sorter operation, the computer arrangement initiates a de-assemble command such that the wafer movement is returned to the original components and the carrier is moved out for external inspection.

Stocker/sorter 32 also has recipe functionality such that wafers are read and grouped in response to instructions from an internal program or from the manufacturing facility system. Recipe functionality includes externally guided recipes and on-demand internal recipes, this functionality being combinable with other system functions that include balancing of cassette types, cassette cleaning and empty cassette integration. Stocker/sorter 32 is programmable to manipulate multiple carrier sets (more that 2) to do large set merge, split, extractions and combinations. Stocker/sorter 32 also verifies the physical dimensional aspects of the carriers and of the production or test wafers, identifies out-of-specification wafers lots and conducts lot compression on test lots or on single wafer lots. The stocker/sorter is programmed to randomly pull cassettes into the system to check verification accuracy. High level functionality is incorporated into Stocker/sorter 32 by having the management system communicate with both stocking and sorting sub-systems through the computer interface or separately by decoupling the stocker and sorter portions. This allows the sub-systems to be separated for production and maintenance purposes. The management system includes a management input module and a business rules module that helps to integrate management directives into the wafer storing and sorting system. For further details on the management input and business rule modules, reference is made to the concurrently filed patent application entitled "Integration of Business Rule Parameters in Priority Setting of Wafer Processing," filed on Feb. 2, 2000, with Ser. No. 09/496,205, which is herein incorporated by reference.

Figure 2:
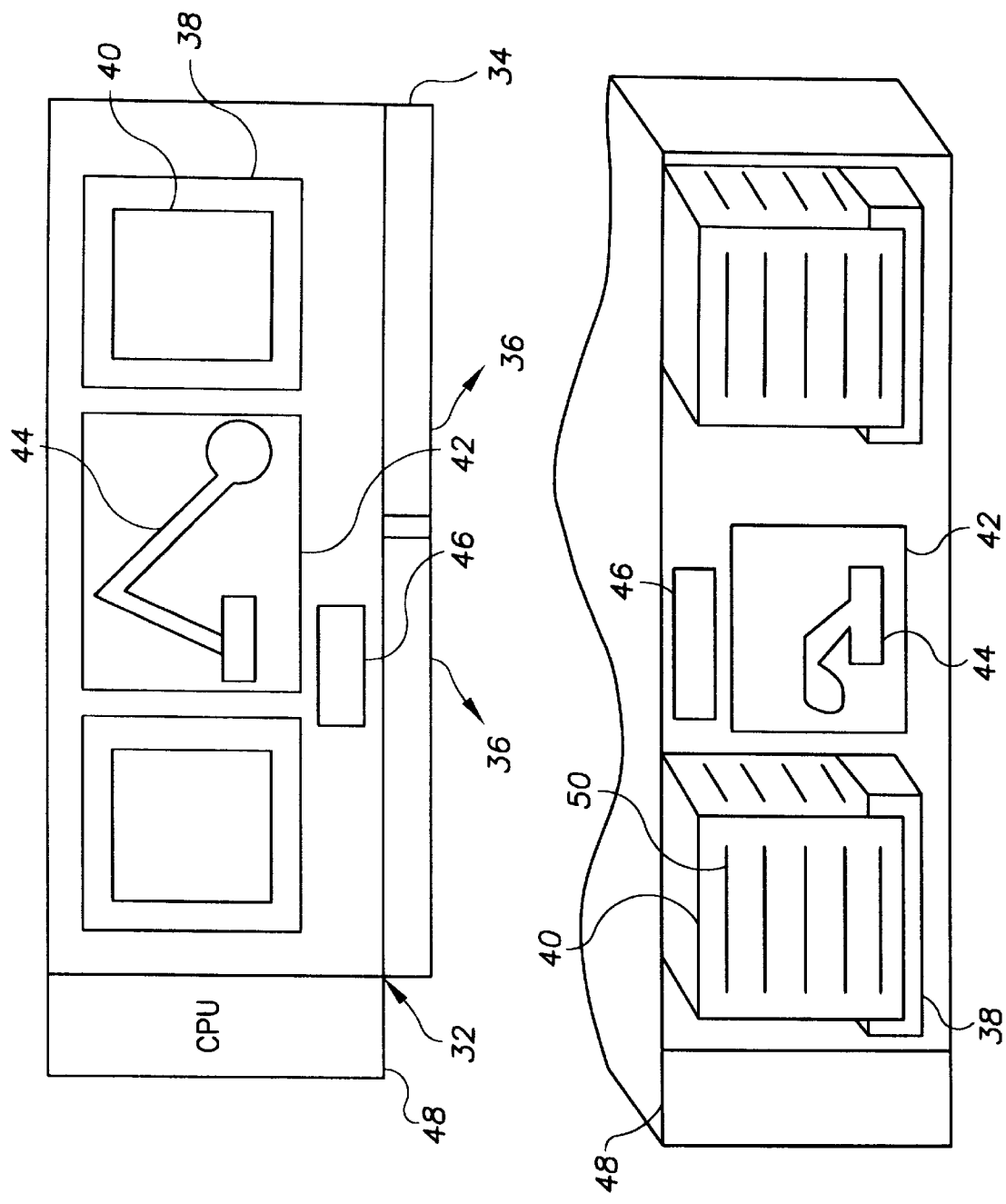
FIG. 2A illustrates a top view of the integrated stocker/sorter apparatus in accordance with an embodiment of the invention.
FIG. 2B illustrates a front view of the integrated stocker/sorter apparatus in accordance with an embodiment of the invention.

Referring to FIGS. 2A–2B, a top view of stocker/sorter 32 illustrates that the it is composed of an enclosure 34, with doors 36, that has various storage bins 38 therein. Storage bins 38 hold various wafer carriers 40; the carriers usually have cassettes that carry the wafers. Stocker/sorter 32 includes a robotic arm mechanism 44 for sorting wafers and carriers within the enclosure. A scanning device, represented by box 46, is located within enclosure 34 and is used for scanning wafers and wafer carriers. Scanning device 46 is also adapted to identify/read codes located on wafer carriers 40 that indicate the position of a wafer within the carrier and by slot. A computer arrangement 48, that is coupled to scanning device 46 and to arm mechanism 44, is adapted to control the scanning device and the arm mechanism and to store data retrieved from the scanning device and the robotic arm.

FIG. 2B illustrates a front view of stocker/sorter 32 with carriers on either side of the sorting mechanism. In another example embodiment, the carriers are on one side of the enclosure with the sorter mechanism on the other side with a barrier disposed within the enclosure that provides a separation between the stored wafers and the wafers being sorted. The barrier is made to provide the capability of decoupling the stocking portion from the sorting portion of stocker/sorter 32. A filtering and airflow system is optionally coupled to the enclosure to provide for a clean environment inside the enclosure. Stocker/sorter 32 also includes a vibration control system coupled to the enclosure that is adapted for substantially reducing vibration within the enclosure and preventing damage to the wafers inside.

Figure 3:
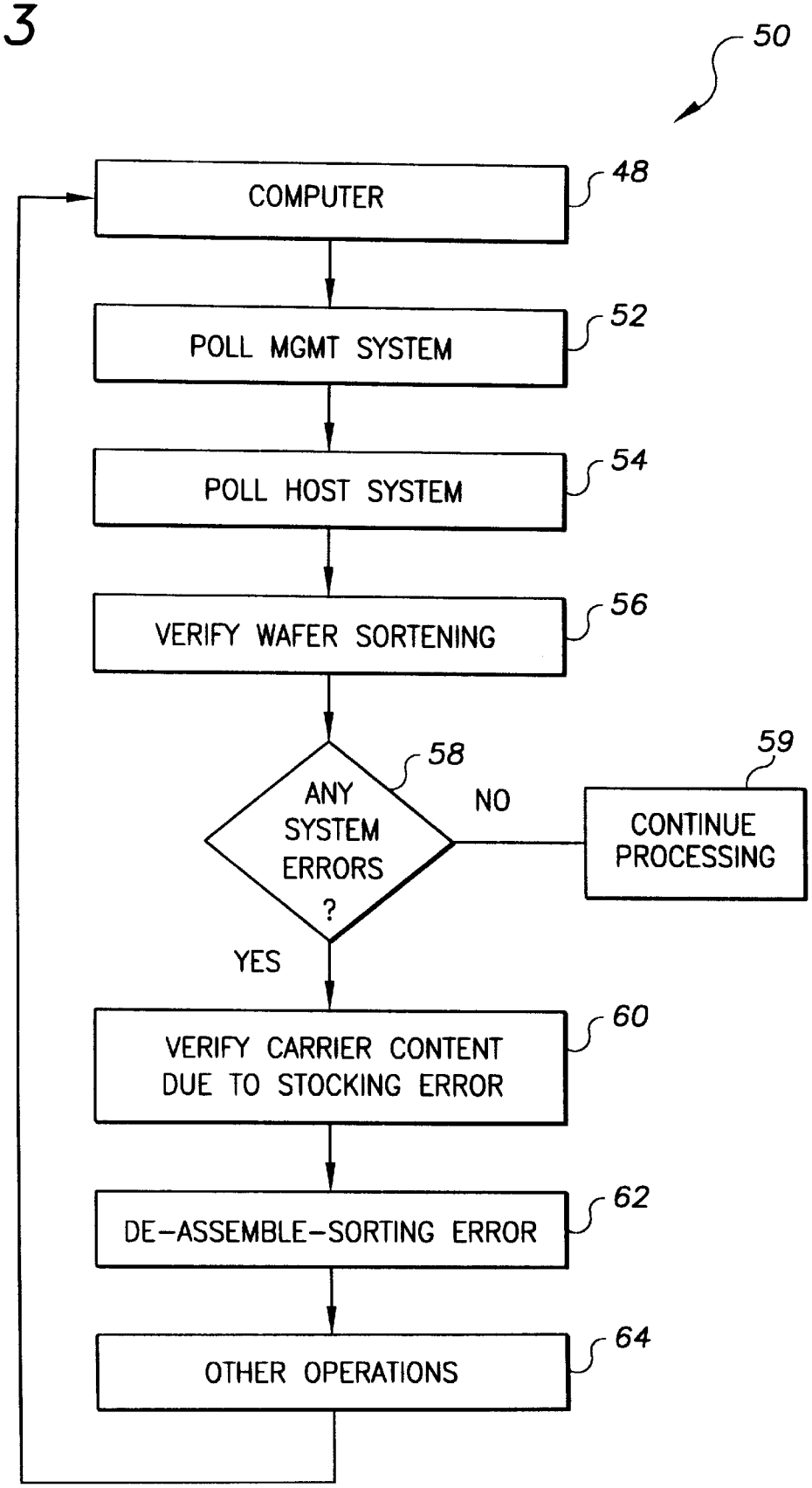
FIG. 3 is a flow diagram of computer arrangement of the stocker/sorter apparatus polling the management and host systems in accordance with an embodiment of the invention.

Referring to FIG. 3, a flow diagram 50 provides an example of how the system and apparatus can be enhanced by having the computer arrangement tied to the manufacturing facility system and the management system to provide for programming options or changes in the manufacturing process during wafer processing. Computer arrangement 48 polls the management system at 52 to determine if any management directives have been issued that might change the stocking/sorting status of the wafers. The host system is also polled at 54 for event changes on the line that will also affect the wafer mix, etc. At 56 the computer arrangement periodically verifies that the wafers are sorted and initiates a sorting function when the wafers are not sorted. At 58 the host system is checked for any errors that have occurred on the processing line. If there are no errors, processing continues at 59. The computer arrangement signals the scanner and sorter to conduct an automatic content verification at 60 of the carriers disposed within the apparatus when a stocking error occurs. At 62, a de-assemble operation for a sorting error will be initiated. The de-assemble operation includes de-assembling wafer movement back to the original components and moving the carrier out of the apparatus for external inspection. The scanner in combination with the sorter 64 can also identify/read, rotate and inspect wafers. The system is capable of compressing wafers lots and test lots.

Figure 4A:
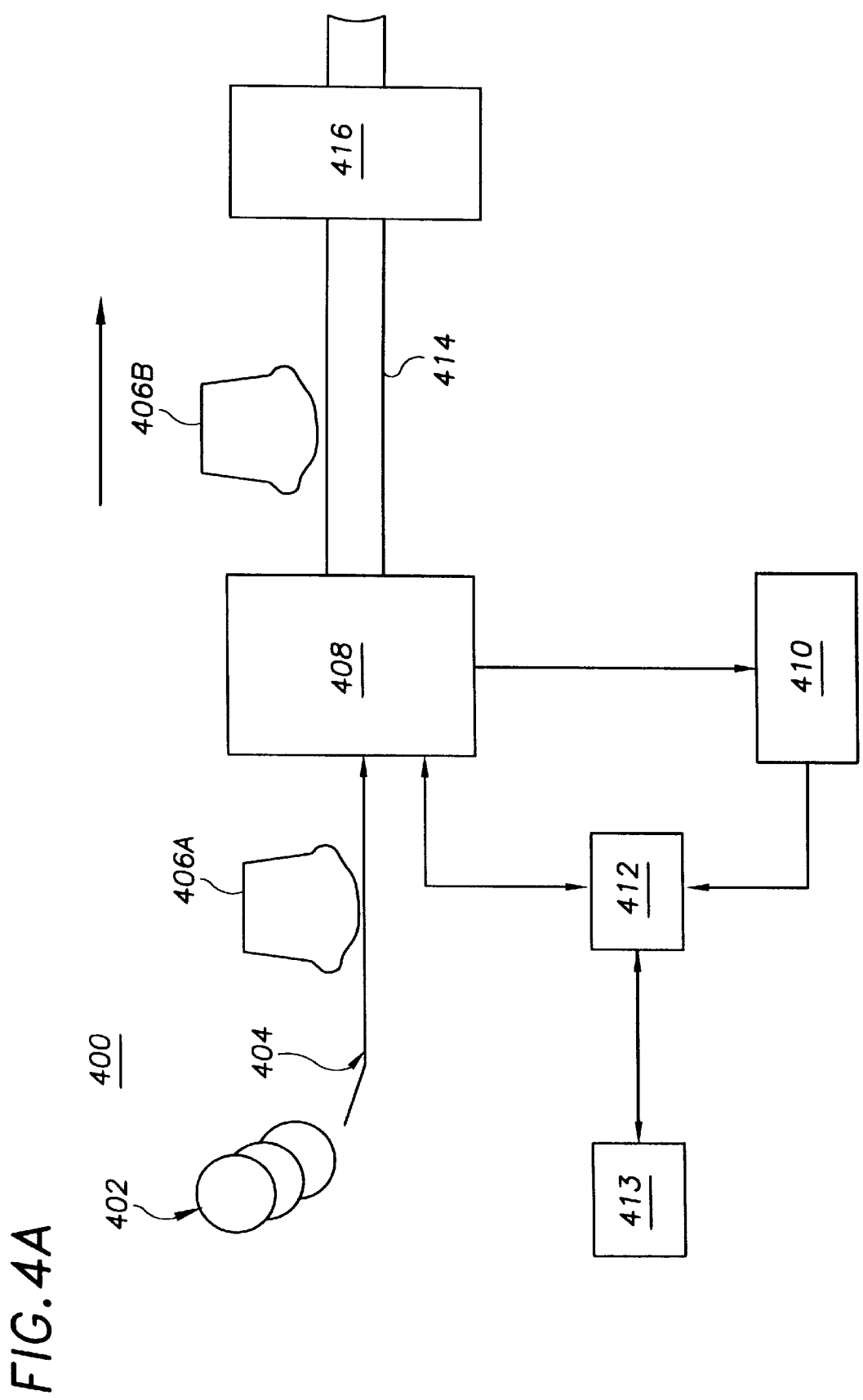
FIG. 4A is a schematic diagram of a system for verifying the integrity of components moving within an automated material handling system in accordance with an embodiment of the invention.
Figure 4B:
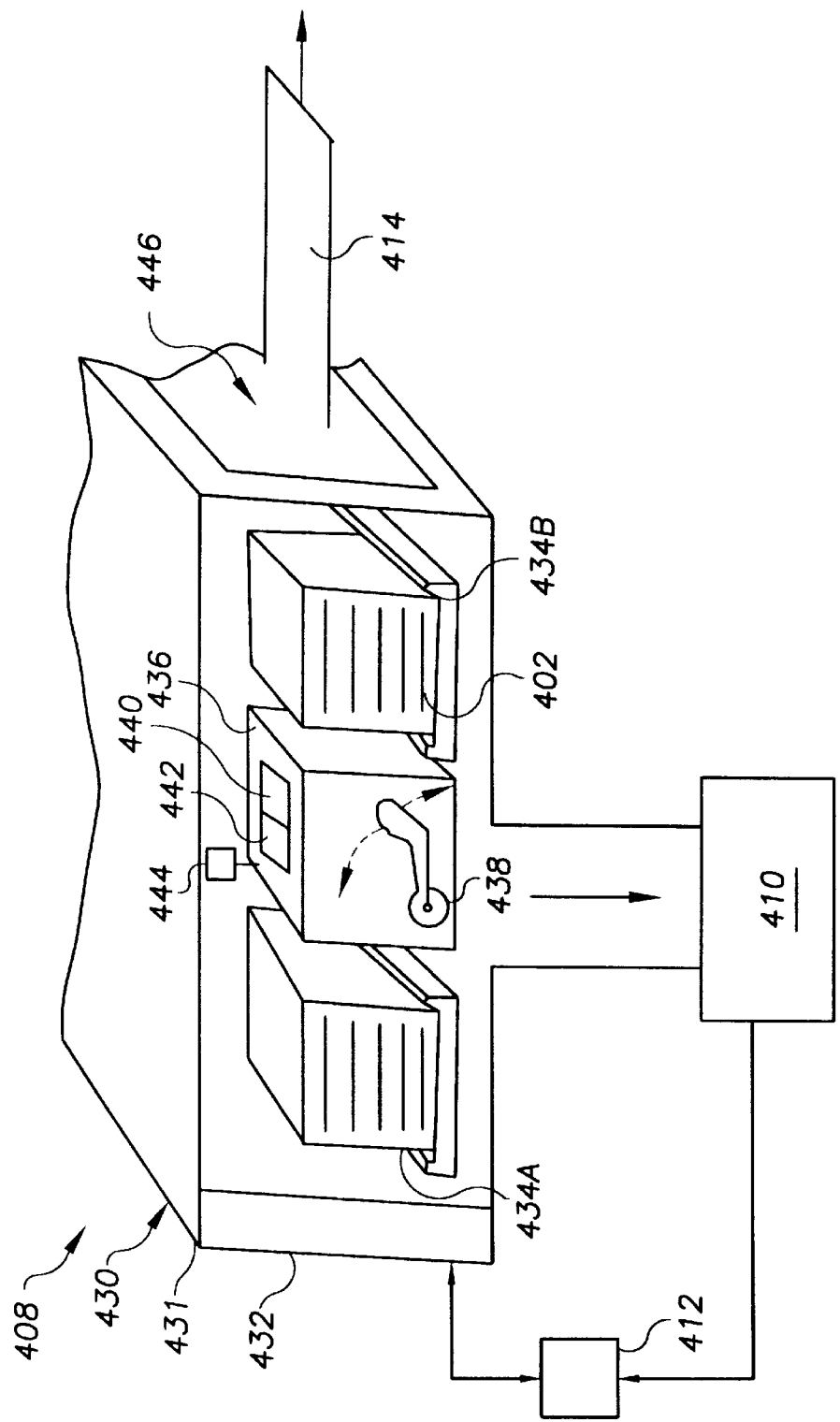
FIG. 4B illustrates a front view of the integrated stocker/sorter/integrity checker in accordance with an embodiment of the invention.

Referring now to FIGS. 4A–4B, FIG. 4A is a schematic diagram of a system 400 for verifying the integrity of components moving into an automated material handling system in accordance with an embodiment of the invention. System 400 takes a wafer lot 402 down a path 404, which in this example is either a conveyor belt or a pick and place robotic arm, and places the wafers in a pod carrier 406A. The pod carrier usually has at least one wafer cassette therein for holding a series of wafers. Before the wafers are moved into the first processing location, the wafers, pod 406A and the cassette pass through an integrity verification device 408 (hereinafter IVD) that is adapted to verify the integrity of components that are moving into an automatic material handling system 414 (hereinafter AMHS). IVD 408 is coupled to a rejected component location 410 and coupled to a computer arrangement 412 having a database therein. Computer arrangement 412 is coupled to the factory's host system computer 413 and to rejected component location 410. After the pod and the other components pass integrity verification, the results are reflected as pod 406B that now travels along AMHS 414 to first processing location 416.

Referring now to FIG. 4B, a front view of the integrated stocker/sorter integrity checker 408 illustrates an enclosure 430 having an access port 431 and a scanning device 432A. Scanning device 432A conducts an external scan of components coming into enclosure 430 and senses the presence of the component with a beam break system. In one example, a laser or optical system scans the cassette or pod carrier that is moving into enclosure 430. Within enclosure 430 is a cassette 434A that holds wafer lot 402 and the wafers are sorted by a sorter device 436 that includes a robotic arm 438. Robotic arm 438 removes the individual wafers and inspects each one with an optical sensor 440 and a particle detector 442. The information obtained is communicated via a communications module 444 to computer 412 for integrity verification. Wafers that pass are placed into cassette 434B before being placed into pod 406B. Wafers that do not pass are rejected and sent to rejection location 410 that is coupled to enclosure 430. The rejection is noted by location 410 with a signal to computer 412 requesting a replacement component. In a related example, the component to be verified is a reticle or bump mask. Where they are rejected, location 410 signals computer 412 to request that another reticle or mask be obtained to replace the rejected component.

Components that have passed integrity verification exit enclosure 430 via an egress port 446 on AMHS 414 on the way to processing location 416. Integrity checker 408 is located proximate to AMHS 414 and in this example temporarily houses all of the components that are being verified. In a related embodiment, the devices internal to enclosure 430 are located proximate to AMHS 414 and verify the integrity of the components as they pass by on AMHS 414 system. Further, with respect to system 400 and IVD 408, arrangements for scanning/inspecting components include not only the beam break sensor system but also a mechanical sensor, a laser system for verifying component presence and count, an optical system and a particle detector varying locations within the enclosure or along the AMHS line.

Figure 5:
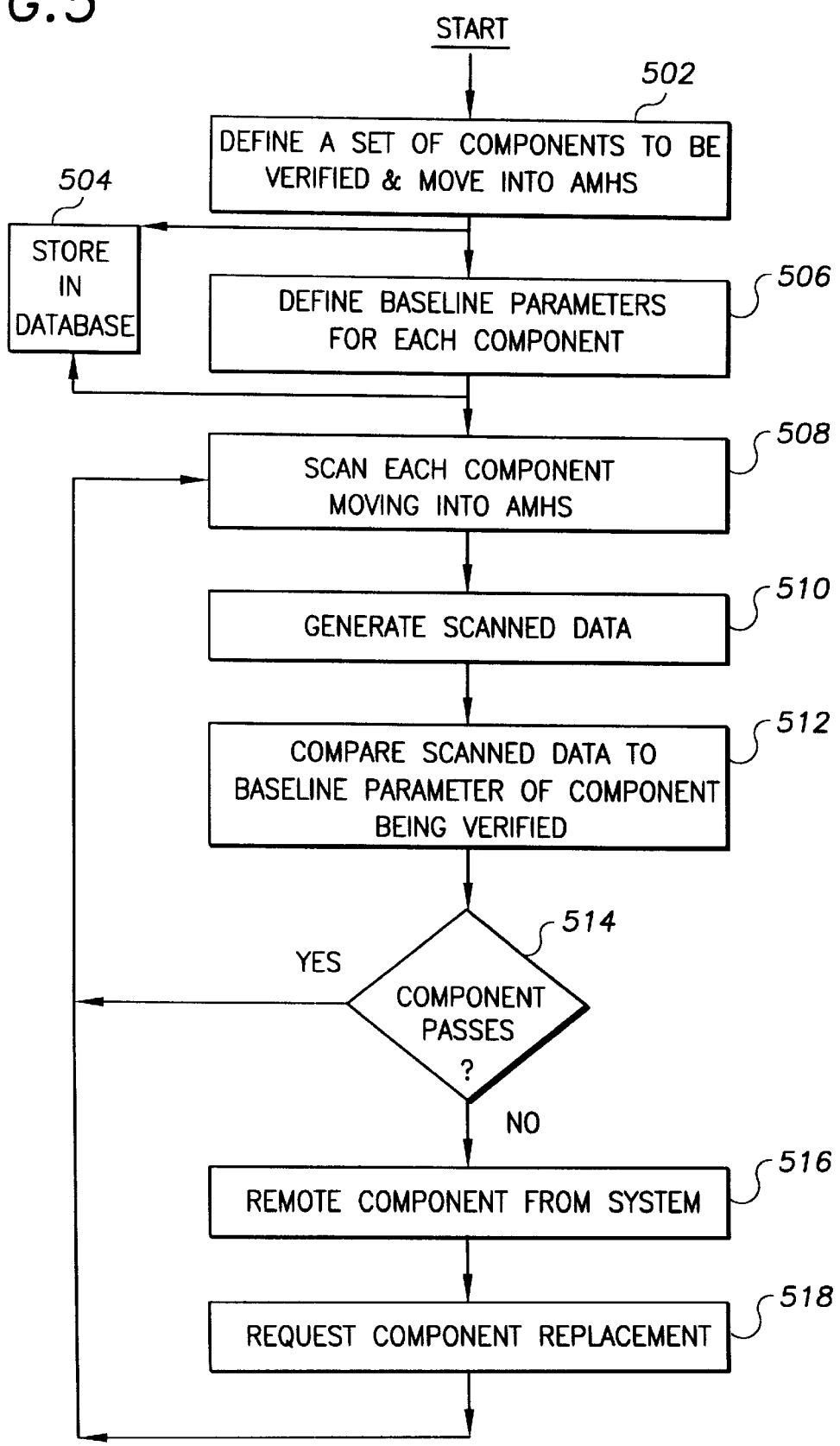
FIG. 5 is a process flow diagram of a method for verifying the integrity of components moving into an automated material handling system in accordance with an embodiment of the invention.

Referring now to FIG. 5, a process flow diagram 500 is exemplary of a method for verifying the integrity of components moving into an automated material handling system. Since there a number of types of components that move within material handling system 414, at block 502 the components to be verified for their integrity are defined first as a set. In one example, the defined set is a pod, a wafer cassette and a wafer. In another example, the defined set is a pod, mask carrier and a mask or reticle. Once defined, the set of information is stored, at block 504, in a database for later use. At block 506, the baseline parameter ranges are defined for each of the components of the defined set. For instance, a cassette will be checked for cracking or warping, integrity of handling points, proper balance, proper cassette dimensions or cross slotting of wafers within the cassette. With respect to a wafer, the baseline parameters or ranges include particle contamination, wafer presence and type, wafer identification, wafer damage or surface refraction measurements. With respect to a pod carrier, the pod type, weight and opening/closing torque is verified. Likewise, with respect to a solder bump mask or a reticle, particle contamination, mask presence, mask identification and mask damage are parameters that are verified for integrity. These parameters are stored for later use in computer 412 at block 504.

At block 508, as the component moves through IVD 408 into the material handling system 414 a beam break system senses the component and scanning/inspection begins by layers—going from the most external layer to the internal layer (e.g. from the pod down to the wafer). At block 510, scanned data on the components is generated, such as condition of the pod, pod type and weight, etc., and this information is then compared to the baseline parameter information in the computer's database at block 512 to verify integrity. At block 514, a determination is made, based on the comparison of the scanned data and the baseline parameter range, whether the component passes integrity verification. If so, the process flow returns to block 508 to scan/inspect the next pod or next layer (e.g. individual wafers). If the pod does not pass integrity verification, the pod is removed at block 516 and sent to location 410 of system 400 and a replacement is requested at block 518 via a signal to computer 412. The process flow then returns to block 508 to scan/inspect the next pod or next layer (e.g. individual wafers). In this part of the process the opening/closing torque of the pod is checked to get feedback on whether the screw mechanism on the pod is still operable or at a point of breaking. Cassettes are also analyzed to determine viability as they arrive from the supplier or as they are coming from the cleaning area (which tends to deteriorate the cassettes rapidly due to the chemicals used). Cassettes are also checked for cross slotting of wafers or the improper placement of two wafers in a single slot before proceeding to the processing location.

In the next layer or level, the wafer lot is analyzed at block 508 and scanned data is generated. Referring briefly to FIG. 4B, the wafers are scanned by sensors in sorter 436 that include, but are not limited to, an optical sensor 440 and a particle detector 442. The information gathered from this analysis is compared with information in computer 412 database to determine whether the integrity of the wafer is acceptable (block 512). If the wafer passes integrity verification at block 514, the wafer is moved into cassette 434B and later into pod 406B. If the wafer does not pass, the wafer is rejected and sent to location 410, in which case a signal is sent to computer 412 that the wafer has been rejected and a new wafer is be to released.

Figure 6:
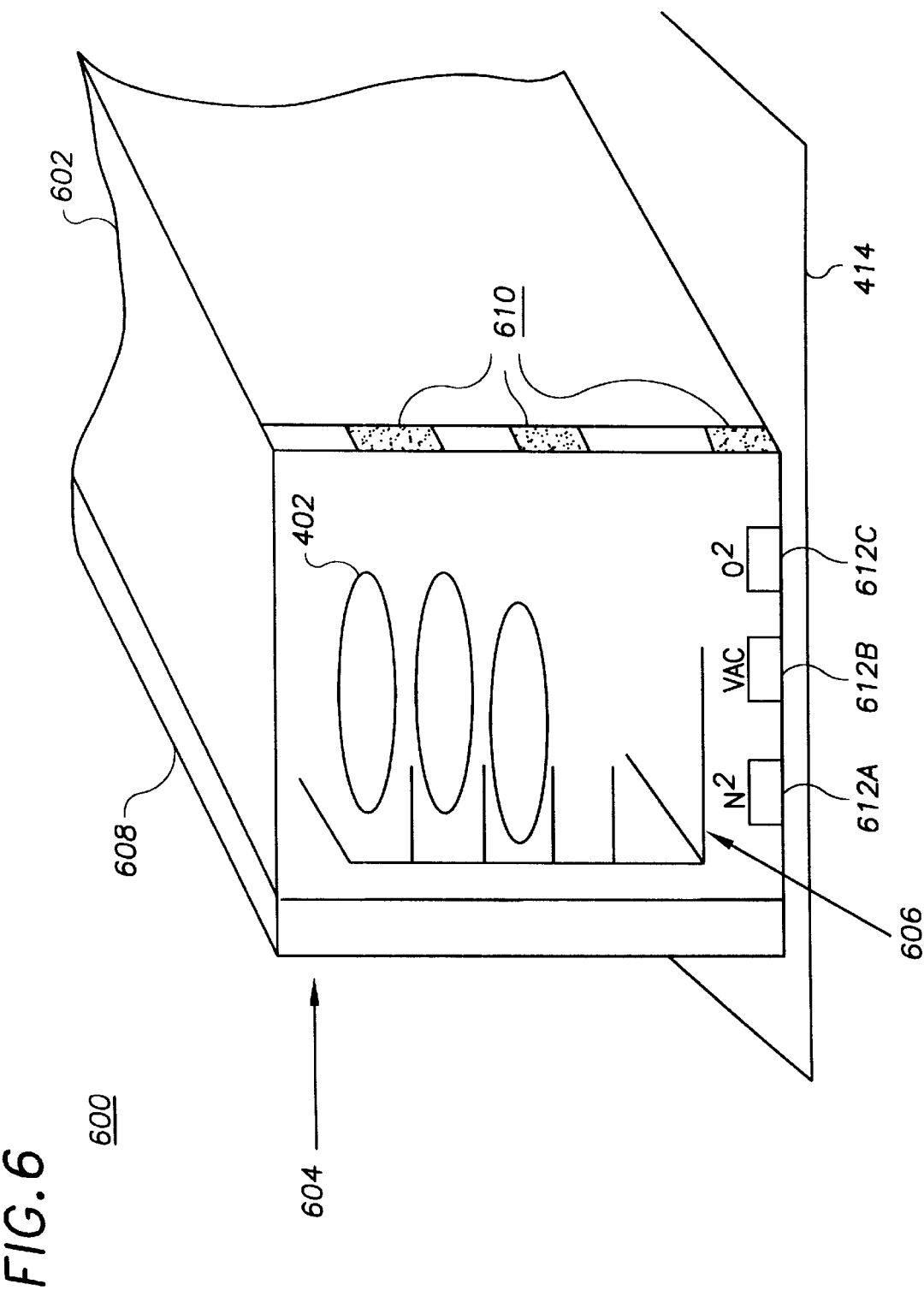
FIG. 6 illustrates a front view of an intelligent component carrier that operates in conjunction with the integrated stocker/sorter/integrity checker in accordance with an embodiment of the invention.

Referring now to FIG. 6, an intelligent component carrier 600 is adapted to operate in conjunction with integrated stocker/sorter/integrity checker 408 in accordance with an embodiment of the invention. Component carrier or smart pod 600 is adapted to transport wafers and wafer cassettes within material handling system 414. The smart pod includes an enclosure 602 having an access port 604. Within enclosure 602 is located a storage bin 606 adapted for storing wafers 402 within the wafer cassette 434. A sensing arrangement 608 for sensing wafer presence and movement through access port 603 is disposed proximate to the storage bin. In this example, the sensing arrangement includes a beam break sensor system, a mechanical sensor, a laser system for verifying component presence and count or an optical system. An arrangement for conducting wafer integrity verification 610 is also included that is within enclosure 602 proximate to wafers 402. In one example, the integrity verifier 610 includes, but is not limited to, a series of devices adapted to act as a particle detector for the wafers, to conduct refractive measurements on the wafers and to verify wafer identification. In a related embodiment, pod 600 includes an arrangement 612 for controlling enclosure environment that is adapted to maintain temperature uniformity and to control the ambient gases. In this example, three valves 612A (nitrogen), 612B (vacuum) and 612C (oxygen) or portals at the bottom of enclosure 602 aid in purging oxygen from the enclosure and in filling the enclosure with nitrogen or simply creating a vacuum. In a related embodiment, the smart pod is available for in situ metrology or for collecting data while the pod travels from one processing location to another.

As noted above, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A method for verifying the integrity of individual components that move within a material handling system of a semiconductor processing plant, the method comprising:
    defining a set of individual components to be verified in the material handling system and storing the defined set as data in a material handling system database;
    defining and storing as data a corresponding baseline parameter range for each component to be verified in the handling system database;
    scanning and generating data on the individual components moving within the material handling system; and
    comparing the scanned component data to the baseline parameter range of the components to verify that the scanned components are acceptable to move within the material handling system.

2. The method of claim 1, after the step of defining the set of components to be verified, further including the step of providing at least one carrier component.

3. The method of claim 2, wherein the carrier component includes at least one from the group consisting of carriers, cassettes, pods and single wafer units.

4. The method of claim 1, after the step of comparing scanned data, further including the step of removing from the material handling system components that are not acceptable.

5. The method of claim 4, further including the step of requesting an additional component to replace the removed component.

6. The method of claim 3, wherein the step of defining the baseline parameter range for the components includes defining the carrier baseline dimensions, the carrier type and weight, the pod type and weight, and the opening and closing torque of the pods.

7. The method of claim 3, wherein the step of defining the baseline parameter range includes defining the cassette handling points, cassette balance points and cassette warpage points and determining existence of wafer cross slotting in the cassette.

8. The method of claim 2, wherein the step of defining the components to be verified includes defining a wafer type, a reticle type and a solder bump mask type.

9. The method of claim 8, wherein the step of defining baseline parameter range include the step of defining wafer attributes, the wafer attributes including at least one from the group consisting of particle contamination, wafer presence, wafer identification and wafer damage.

10. The method of claim 8, wherein the step of defining baseline parameter range includes the step of defining mask attributes, the mask attributes including at least one from the group consisting of particle contamination, mask presence, mask identification and mask damage.

11. The method of claim 1, wherein the step of scanning components includes using at least one from the group consisting of a beam break sensor system, a mechanical sensor, a laser system for verifying component presence and count, an optical system and a particle detector.

12. The method of claim 1, after defining the set of components, further including the steps of:
    providing a pod carrier adapted to transport components included in the defined component set; and
    verifying the integrity of the components within the pod carrier.

13. A system for verifying the integrity of individual components that move within a material handling system of a semiconductor processing plant, the system comprising:
    means for defining a set of individual components to be verified in the material handling system and storing the defined set as data in a material handling system database;
    means for defining and storing as data a corresponding baseline parameter range for each component to be verified in the handling system database;
    means for scanning and generating data on the individual components moving within the material handling system; and
    means for comparing the scanned component data to the baseline parameter range of the components to verify that the scanned components are acceptable to move within the material handling system.

14. The system of claim 13, further including a pod carrier adapted to transport components included in the defined component set and adapted to verify the integrity of the components within the pod.

15. The system of claim 14, wherein the pod carrier is comprised of:
    an enclosure having an access port;
    a storage bin adapted for storing a set of wafer cassettes and at least one wafer;
    means for sensing wafer presence and movement through access port disposed proximate to the cassette within the enclosure;
    means for conducting wafer integrity verification; and
    means for controlling enclosure environment.

* * * * *

UNITED STATES PATENT AND TRADEMARK OFFICE
CERTIFICATE OF CORRECTION

PATENT NO.      : 6,431,814 B1
DATED           : August 13, 2002
INVENTOR(S)     : Christensen et al.

It is certified that error appears in the above-identified patent and that said Letters Patent is hereby corrected as shown below:

Column 6,
Line 27, "illustrates that the it" should read -- illustrates that it --.

Column 10,
Line 15, "include" should read -- includes --.

Signed and Sealed this

Fourth Day of February, 2003

JAMES E. ROGAN
*Director of the United States Patent and Trademark Office*